United States Patent
Conley et al.

(10) Patent No.: US 10,812,013 B2
(45) Date of Patent: Oct. 20, 2020

(54) FRAME ASSEMBLIES AND PHOTOVOLTAIC DEVICES INCLUDING THE SAME

(71) Applicant: First Solar, Inc., Tempe, AZ (US)

(72) Inventors: Joshua Conley, Perrysburg, OH (US); Benjamin DeFresart, Chandler, AZ (US); Peter Hruby, Scottsdale, AZ (US); Matthew Kuzila, Phoenix, AZ (US); Daniel Smith, Gilbert, AZ (US); Thomas Truman, Toledo, OH (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 16/193,983

(22) Filed: Nov. 16, 2018

(65) Prior Publication Data

US 2019/0158016 A1 May 23, 2019

Related U.S. Application Data

(60) Provisional application No. 62/587,885, filed on Nov. 17, 2017.

(51) Int. Cl.
| | |
|---|---|
| *H02N 6/00* | (2006.01) |
| *H01L 31/042* | (2014.01) |
| *H02S 30/10* | (2014.01) |
| *H01L 31/048* | (2014.01) |

(52) U.S. Cl.
CPC .......... *H02S 30/10* (2014.12); *H01L 31/0488* (2013.01)

(58) Field of Classification Search
CPC .................................................... H02S 30/10
See application file for complete search history.

(56) References Cited

U.S. PATENT DOCUMENTS

| | | |
|---|---|---|
| D389,454 S | 1/1998 | Mori |
| D524,727 S | 7/2006 | Yamashita et al. |
| D644,986 S | 9/2011 | Ross et al. |
| D662,042 S | 6/2012 | Yeh |
| D739,345 S | 9/2015 | Buller et al. |
| 9,551,510 B2 | 1/2017 | Hartelius et al. |
| 2010/0132766 A1* | 6/2010 | Jenkins ................. H01L 31/048 136/251 |
| 2012/0174504 A1* | 7/2012 | Ferrara ................. F24S 25/632 52/173.3 |

OTHER PUBLICATIONS

Bredder et al., "The Shape of Things to Come", Web Article, LinkedIn, Aug. 2017, pp. 1-4, https://www.linkedin.com/pulse/shape-things-come-roger-bredder/.

"First Solar Series 6: Next Generation Thin Film Solar Technology", Datasheet, First Solar, Sep. 2017, pp. 1-2, http://www.firstsolar.com/-/media/First-Solar/Technical-Documents/Series-6-Datasheets/Series-6-Datasheet.ashx?la=en.

(Continued)

*Primary Examiner* — Angelo Trivisonno
(74) *Attorney, Agent, or Firm* — MacMillan, Sobanski & Todd, LLC

(57) ABSTRACT

A photovoltaic device can include a module and a rail. The module can have an edge formed around a perimeter of the module. The rail can include a coupling surface at a top side of the rail, and a recessed surface offset from the coupling surface and towards a bottom side of the rail.

20 Claims, 9 Drawing Sheets
(1 of 9 Drawing Sheet(s) Filed in Color)

(56) References Cited

OTHER PUBLICATIONS

"Series 6: Gaining Ground—the Rise of Thin Film PV", Webinar presentation, First Solar, Sep. 2017, pp. 1-29, http://www.firstsolar.com/en/About-Us/Press-Center/2017/09/The-Shape-of-Things.

"First Solar Series 6: Thin Film Modules Next Generation Solar Technology", Brochure, First Solar, Sep. 2017, pp. 1-4, http://www.firstsolar.com/-/media/First-Solar/Technical-Documents/Series-6-Datasheets/Series-6-Brochure.ashx?la=en.

"Experience the new Series 6 module and discover why it's the next generation of Solar PV technology", First Solar, Web video published on LinkedIn, video length 2 min. 35 sec., Sep. 2017, available at https://www.linkedin.com/feed/update/urn:li:activity:6343846726914449409.

Strevel, "The Optimal PV Module Size", Series 6 Poster, Solar Power International conference, U.S., Sep. 2017, http://www.firstsolar.com/-/media/First-Solar/Technical-Documents/Series-6-Datasheets/Series-6-Optimal-Module-Size-Factsheet.ashx.

\* cited by examiner

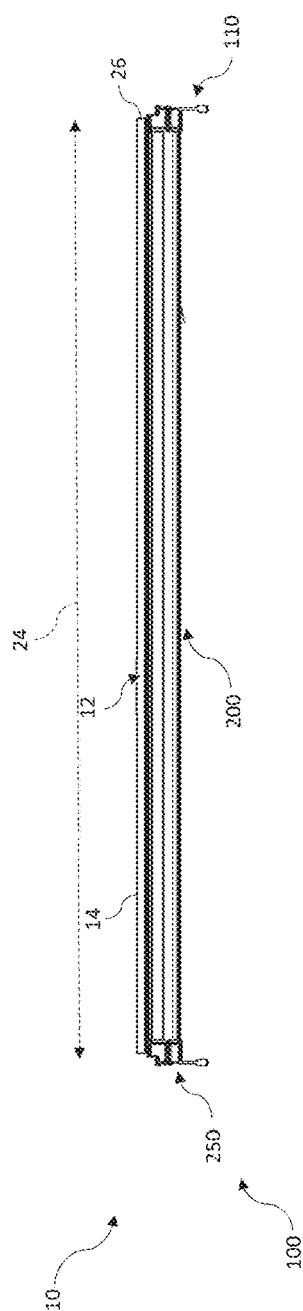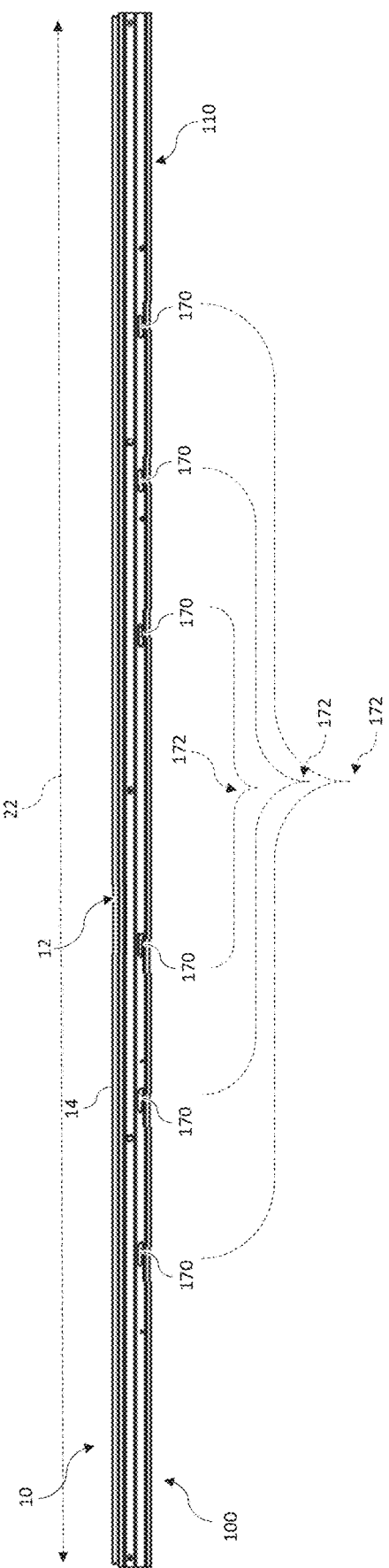
FIG. 3
FIG. 4

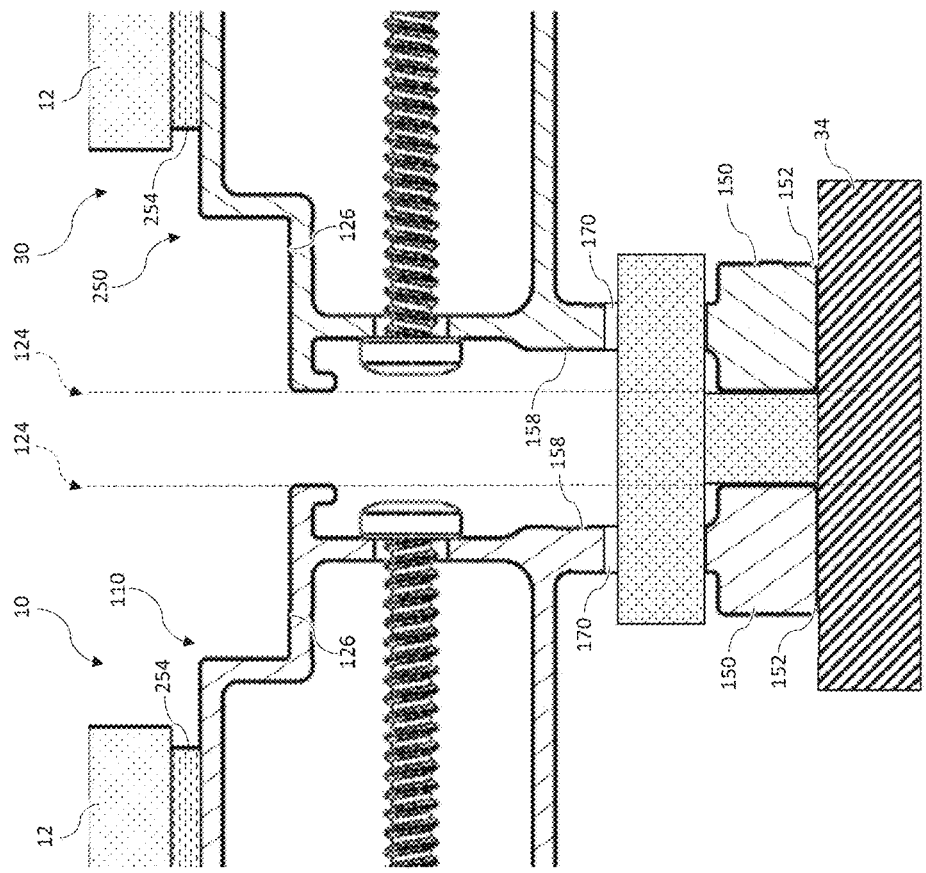
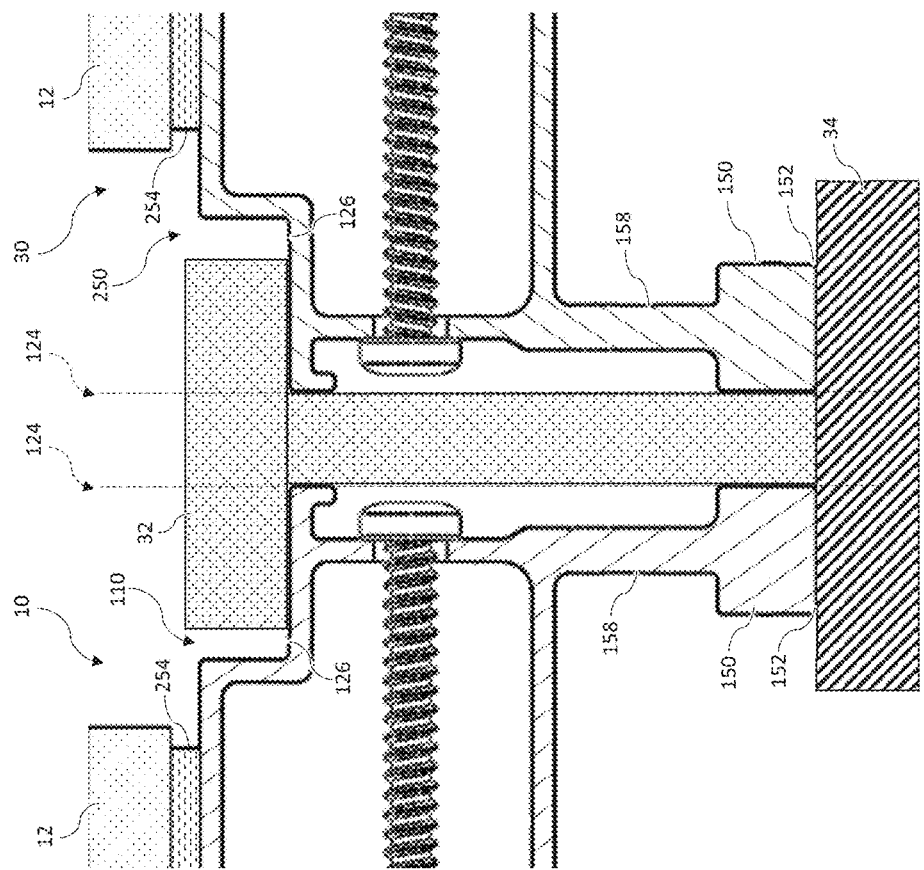

FRAME ASSEMBLIES AND PHOTOVOLTAIC DEVICES INCLUDING THE SAME

CROSS-REFERENCE TO RELATED APPLICATIONS

This application claims priority from U.S. Provisional Patent Application No. 62/587,885, filed on Nov. 17, 2017, which is incorporated by reference herein in its entirety.

BACKGROUND

The present specification generally relates to structures for use with photovoltaic devices and, more specifically, to frame assemblies for use with photovoltaic devices.

Photovoltaic devices generate electrical power by converting light into electricity using semiconductor materials that exhibit the photovoltaic effect. The semiconductor materials can be at least partially enclosed within a module. The module can be coupled to a mounting structure (e.g., frames, clips, etc.) configured to mount the photovoltaic device upon stationary or tracking support members such as, for example, racks, tables, poles, or the like.

A photovoltaic power station can include multiple photovoltaic devices that are configured to supply power to an electrical grid. Generally, the number of photovoltaic devices used in photovoltaic power stations can be on the order of tens of thousands, hundreds of thousands, millions or more. Accordingly, the amount of shipping material and the amount of installation time associated with each individual photovoltaic device can have a large impact on the cost of constructing a photovoltaic power station. The form and function of the mounting structure coupled to the photovoltaic device can affect the amount of shipping material and the amount of installation time associated with the photovoltaic device.

Accordingly, a need exists for alternative frame assemblies for use photovoltaic devices.

SUMMARY

The embodiments provided herein relate to frame assemblies for use photovoltaic devices. These and additional features provided by the embodiments described herein will be more fully understood in view of the following detailed description, in conjunction with the drawings.

BRIEF DESCRIPTION OF THE DRAWINGS

The patent or application file may contain one or more drawings executed in color and/or one or more photographs. Copies of this patent or patent application publication with color drawing(s) and/or photograph(s) will be provided by the U.S. Patent and Trademark Office upon request and payment of the necessary fees.

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 3 schematically depicts a first side view of the photovoltaic device of FIG. 1 according to one or more embodiments shown and described herein;

FIG. 4 schematically depicts a second side view of the photovoltaic device of FIG. 1 according to one or more embodiments shown and described herein;

FIGS. 9A and 9B schematically depict an array of photovoltaic devices according to one or more embodiments shown and described herein.

DETAILED DESCRIPTION

Figure 1:
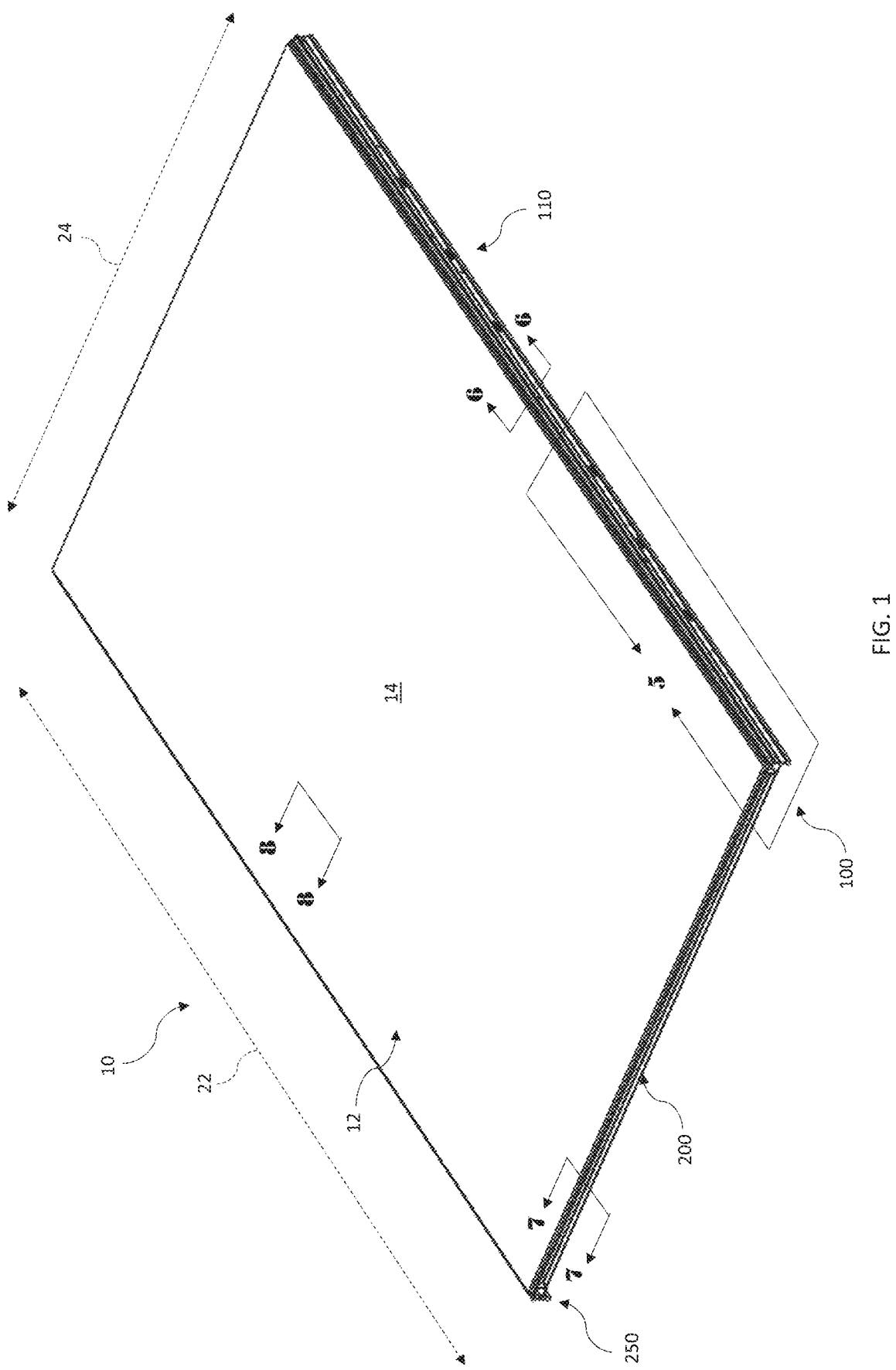
FIG. 1 schematically depicts a perspective view of a photovoltaic device according to one or more embodiments shown and described herein.

FIG. 1 generally depicts one embodiment of a photovoltaic device including a frame assembly for mounting the photovoltaic device to a mounting structure. The frame assembly generally includes one or more rails configured for mounting to a mounting structure and one or more support beams for strengthening the frame assembly. Various embodiments of the frame assembly and photovoltaic devices including the same will be described in more detail herein.

With collective reference to FIGS. 1, 2, 3, and 4, a photovoltaic device 10 is schematically depicted. The photovoltaic device 10 can include semiconductor material that is operable to generate electrical power when exposed to photons. For example, the photovoltaic device 10 can generate electrical power when illuminated by the sun. Suitable semiconductor materials include, for example, crystalline silicon (e.g., Multi-Si, Mono-Si, Ribbon-Si, and the like) or thin film (e.g., a-Si, CdTe, $Cu(InGa)Se_2$, and the like). Accordingly, while the embodiments described herein have particular utility for CdTe based thin film semiconductor material such as, for example, binary, ternary, or quaternary systems comprising cadmium and tellurium, the present disclosure is not limited to any particular semiconductor material system.

The semiconductor material can be provided within a module 12. For example, the module 12 can include a front sheet 14 and a back sheet 16. During operation of the photovoltaic device 10, the front sheet 14 can be directed towards a source of illumination. For example, when provided upon a tracking system, the front sheet 14 can be configured to articulate with the sun to increase the quantity of photons absorbed by the semiconductor material. Accordingly, the front sheet 14 can define a front side 18 of the module 12. The front sheet 14 be formed from substantially transparent materials such as, for example, glass. Suitable glass can include soda-lime glass, or any glass with reduced iron content. In some embodiments, the front sheet 14 can be coated with a coating configured to interact with light or to improve durability of the front sheet 14 such as, but not limited to, an antireflective coating, an antisoiling coating, or a combination thereof. The back sheet 16 can be provided opposite the front sheet 12 and define a back side 20 of the module 12. Generally, the back sheet 16 is formed from material suitable to support and protect the semiconductor material. Accordingly, the back sheet 16 can include any suitable material, including, for example, glass (e.g., soda-lime glass), plastic, or metal.

The photovoltaic device 10 can include a frame assembly 100 configured to provide structural support to the module 12 and to provide a means for to a mounting the photovoltaic device 10 upon support members. The frame assembly 100 can include one or more rails 110 that defines span along a length 22 of the module 12. The rail 110 can be formed from a rigid material such as, for example, a metallic material. Suitable metal material includes, but is not limited to, aluminum (e.g., 6063 Type 2 Anodized Aluminum). In some embodiments, the rail 110 can be from via an extrusion process.

Figure 5:
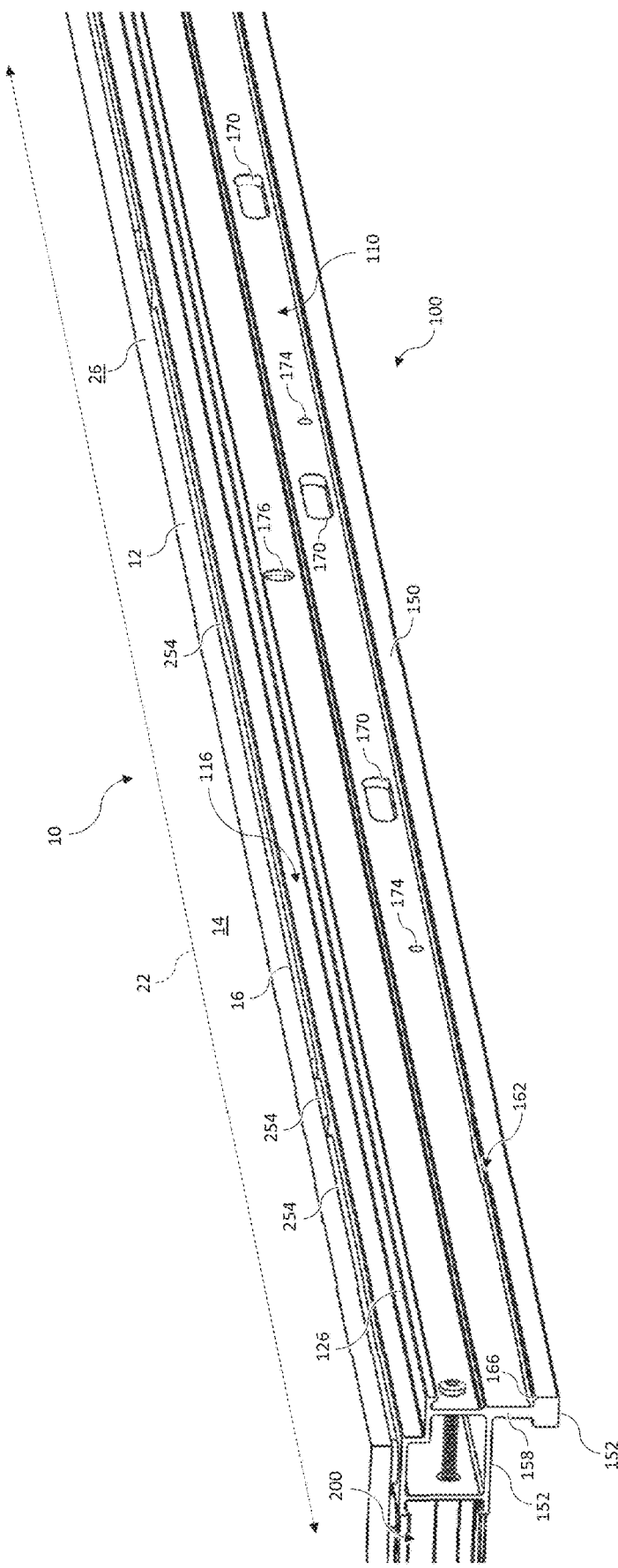
FIG. 5 schematically depicts enlarged view 5 the photovoltaic device of FIG. 1 according to one or more embodiments shown and described herein.
Figure 6:
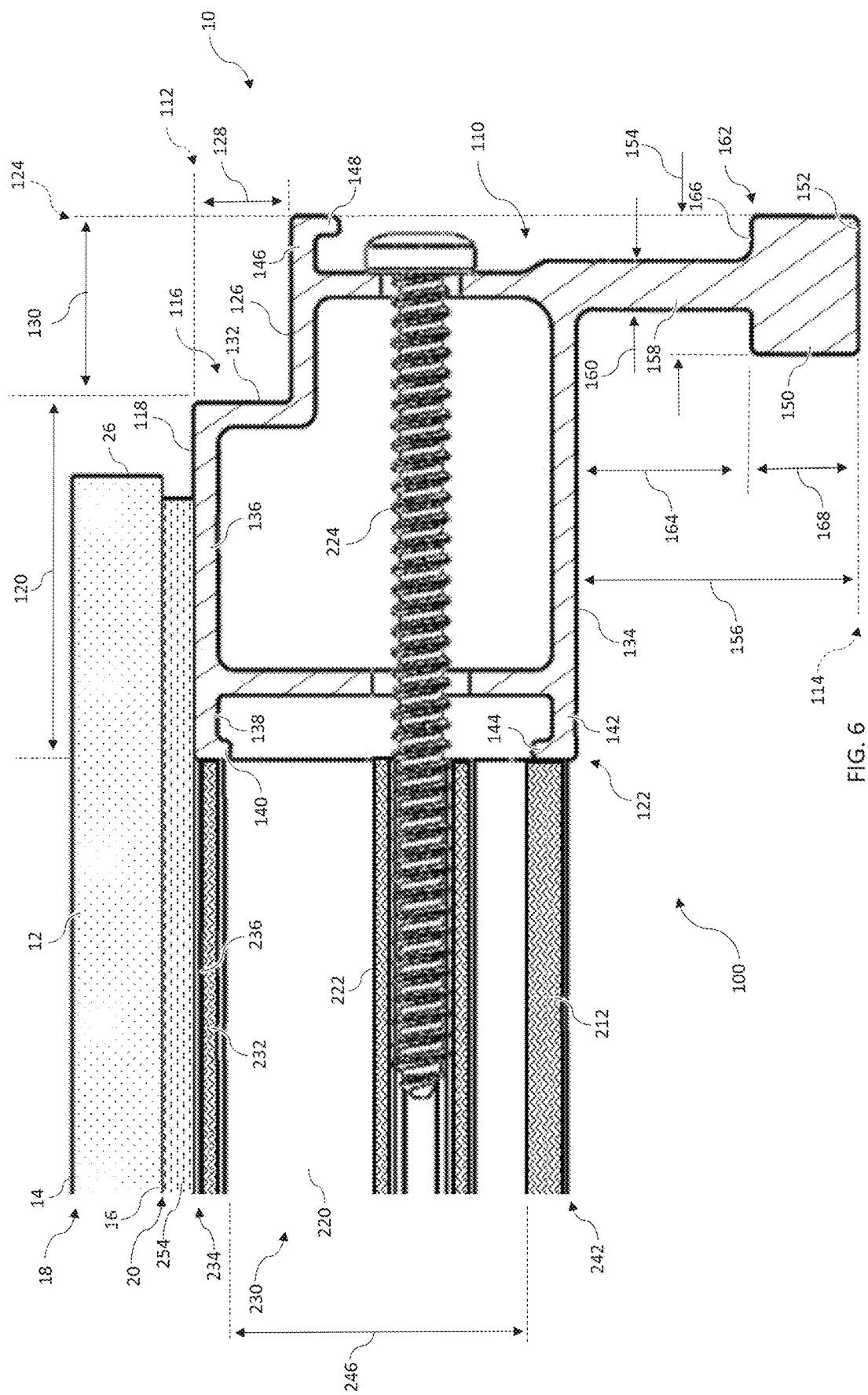
FIG. 6 schematically depicts a cross-sectional view of the photovoltaic device of FIG. 1 taken along 6-6 according to one or more embodiments shown and described herein.
Figure 7:
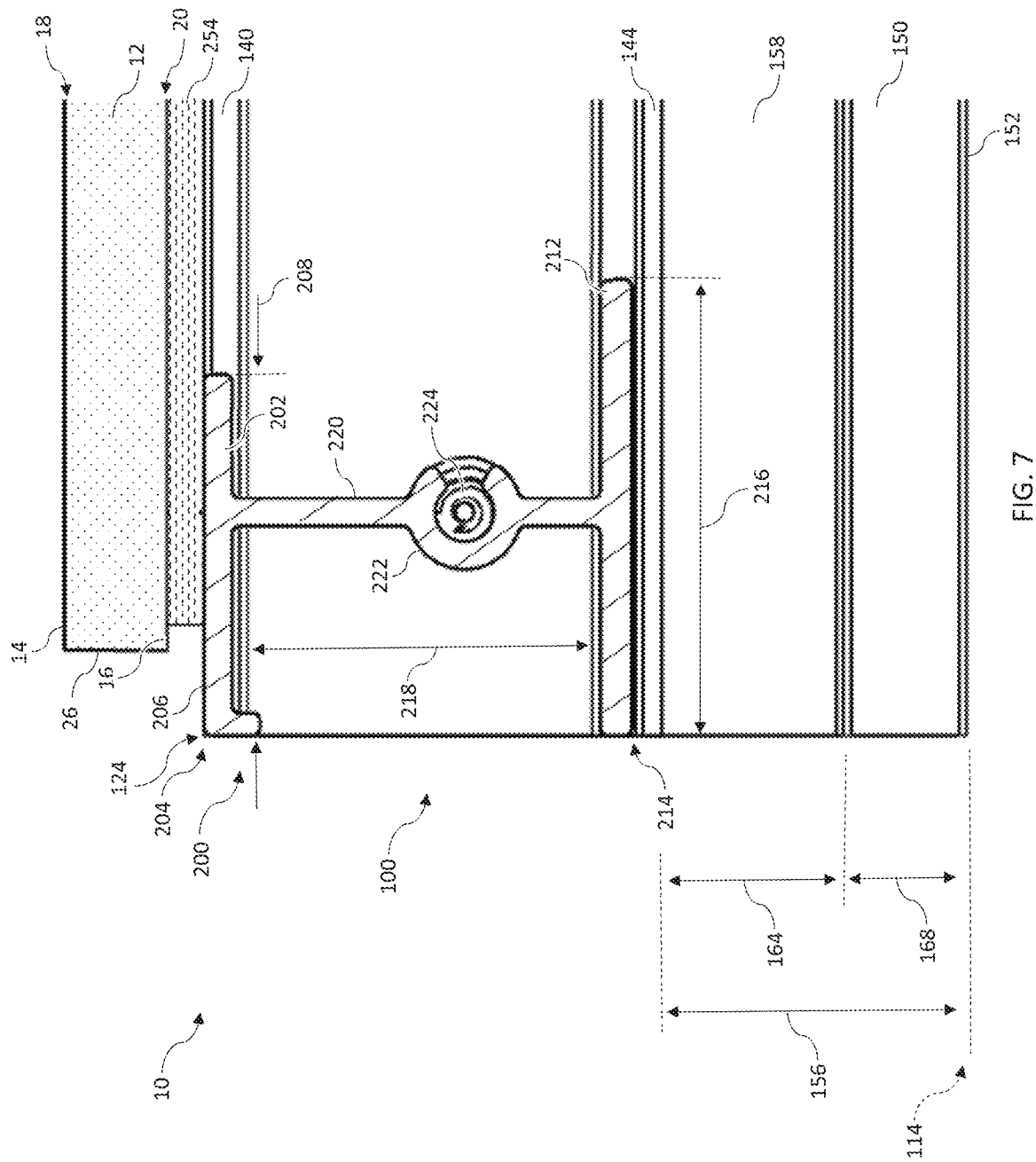
FIG. 7 schematically depicts a cross-sectional view of the photovoltaic device of FIG. 1 taken along 7-7 according to one or more embodiments shown and described herein.

Referring now to FIGS. 5 and 6, the rail 110 can span from a top side 112 downward to a bottom side 114. The rail 110 can include a head section 116 for supporting the back sheet 16. The head section 112 can define a coupling surface 118 provided at the top side 112 of the rail 110. The coupling surface 118 can be a substantially flat surface suitable for supporting the back sheet 16. For example, the coupling surface 118 can provide a substantially flat surface along a width 120 of the coupling surface 118. Specifically, the width 120 can extend from an interior side 122 of the rail 110 towards the exterior side 124 of the rail 110.

The rail 110 can include a recessed surface 126 offset from the coupling surface 118 and towards the bottom side 114 of the rail 110. The recessed surface 126 can be offset from the coupling surface 118 by a recess distance 128. In some embodiments, the recessed surface 126 can be substantially flat along a width 130 of the recessed surface 126. The width 130 can extend from the exterior side 124 of the rail 110 towards the interior side 122 of the rail 110. In some embodiments, the head section 116 can include a riser 132 that extends from the coupling surface 118 to the recessed surface 126 and spans the recess distance 128. The riser 132 can be substantially orthogonal to both the coupling surface 118 and the recessed surface 126. Accordingly, in some embodiments, the coupling surface 118 and the recessed surface 126 can be substantially parallel with respect to one another. A bottom face 134 of the head section 116 can be positioned between the top side 110 and the bottom side 114 of the rail 110. In some embodiments, at least a portion of the bottom face 134 can be provided directly beneath the coupling surface 118.

According to the embodiments provided herein, the head section 116 can include a tubular body 136, which is depicted in FIG. 6 as body having a substantially rectangular cross-section with a stepped upper wall. In some embodiments, the head section 116 can include a top interior projection 138 located at the top side 112 of the rail 110. The top interior projection 138 can extend from the tubular body 136 to the interior side 122 of the rail 110. The coupling surface 118 can be partially formed by the top interior projection 138. The top interior projection 138 can be provided with a rib 140 configured to stiffen the top interior projection 138. Alternatively or additionally, the head section 116 can include a bottom interior projection 142 located between the top side 112 and the bottom side 114 of the rail 110. The bottom interior projection 142 can extend from the tubular body 136 to the interior side 122 of the rail 110. The bottom face 134 of the head section 116 can be partially formed by the bottom interior projection 142. The bottom interior projection 142 can be provided with a rib 144 configured to stiffen the bottom interior projection 142.

Referring still to FIGS. 5 and 6, the head section 116 can include an exterior projection 146 located between the top side 112 and the bottom side 114 of the rail 110. The exterior projection 146 can extend from the tubular body 136 to the exterior side 124 of the rail 110. The recessed surface 126 of the head section 116 can be partially formed by the exterior projection 146. The exterior projection 146 can be provided with a rib 148 configured to stiffen the exterior projection 146.

The rail 110 can include a base member 150 configured to support the load carried by the frame assembly 100 upon a surface. The base member 150 can be located at the bottom side 114 of the rail 110. Specifically, the base member 150 can define a support surface 152 located at the bottom side 114 of the rail 110. The support surface 152 can define a width 154 of the base member 150. In some embodiments, the width 154 of the base member 150 can be less than the width 130 of the recessed surface 126. For example, the width 154 of the base member 150 can be less than about 95% of the width 130 of the recessed surface 126 such as, for example, less than about 85% in one embodiment, less than about 80% in another embodiment, or between about 60% and about 90% in a further embodiment.

The base member 150 can be offset from the bottom face 134 of the head section 116. For example, a base offset distance 156 can be defined between the support surface 152 of the base member 150 and the bottom face 134 of the head section 116. In some embodiments, the base offset distance 156 can be greater than the recess distance 128. For example, the base offset distance 156 can be at least about 125% of the recess distance 128 such as, for example, greater than about 175% in one embodiment, greater than about 225% in another embodiment, or between about 200% and about 350% in a further embodiment.

Referring still to FIGS. 5 and 6, the rail 110 can include a support plate 158 extending downward from the head section 116 to the base member 150. The support plate 158 can have a wall thickness 160, which is smaller than the width 154 of the base member 150. Accordingly, a shoulder 162 can be defined between the bottom face 134 of the head section 116 and the bottom side 114 of the rail 110. Specifically, the shoulder 162 can be offset from the bottom face 134 of the head section 116 by a height 164 of the support plate 158. In some embodiments, the height 164 of the support plate 158 can be greater than the recess distance 128. For example, the height 164 of the support plate 158 can be at least about 125% of the recess distance 128 such as, for example, greater than about 175% in one embodiment, or between about 150% and about 250% in another embodiment.

In some embodiments, the base member 150 can be a body that provides a mounting surface 166 at the shoulder 162. For example, the base member 150 can have a substantially rectangular cross-section. Accordingly, the mounting surface 166 can be substantially flat and substantially parallel to the recessed surface 126. It is noted that the body can be provided in any shape corresponding to a desired clamping mechanism. Thus, the mounting surface 166 can be contoured or faceted to provide a shape complimentary to any desired clamping mechanism. Moreover, the base member 150 can define a height 168 of the mounting surface 166 with respect to the support surface 152. The height 168 of the mounting surface 166 can be between about 75% and about 150% of the recess distance 128. In another embodiment, the height 168 of the mounting surface 166 can be greater than or equal to the recess distance 128. In some embodiments, the exterior side 124 of the base member 150 and the exterior side 124 of the coupling surface 118 can be substantially flush.

Referring collectively to FIGS. 4 and 5, the rail can 110 include one or more orifices for facilitating transport and mounting of the photovoltaic device 10. In some embodiments, one or more slots 170 can be formed through the support plate 158. For example, each slot 170 can bound a shaped orifice that is correspondingly shaped with mounting hardware. Specifically, the slot 170 can include a flat bottom that is substantially parallel with the support surface 152 of the base member 150. Optionally, pairs 172 of the slots 170 can be centered with respect to a datum of the frame assembly 100. For example, pairs 172 of slots 170 can be centered with respect to the center of the rail 110. The support plate 150 can further include one or more substantially circular bores 174 to facilitate the mounting of wire management harnesses. Accordingly, each bore 172 can be tapped to formed threads for receiving fasteners. Alternatively or additionally, the rail 110 can include one or more lifting orifices 176 shaped to receive a lifting pin. For example, in some embodiments, each lifting orifice 176 can be formed through the exterior side 124 of the head section 116 of the rail 110.

Referring collectively to FIGS. 1, 2, 3, and 7, the frame assembly 100 can include one or more support beams 200 that define a span along a width 24 of the module 12. Each support beam 200 can be formed from rigid materials, as described above with respect to the rail 110. The support beam 200 can include a top flange 202 located at a top side 204 of the support beam 200. The top flange 202 can define a coupling surface 206 provided at the top side 204 of the support beam 200. The coupling surface 206 can be a substantially flat surface suitable for supporting the back sheet 16 along a width 208 of the top flange 202. In some embodiments, a rib 210 can extend downward from an edge of the top flange 202.

The support beam 200 can include a bottom flange 212 located at a bottom side 214 of the support beam 200. The bottom flange 212 can extend along a width 216. In some embodiments, the width 216 of the bottom flange 212 can be greater than the width 208 of the top flange 202. The bottom flange 212 can be offset from the top flange 202 by a flange offset distance 218. A web 220 can span the flange offset distance 218 to connect the top flange 202 to the bottom flange 212. The web 220 can include a channel 222 for receiving a fastener 224 such as, for example, a screw or a bolt. In some embodiments, the channel 222 can be located closer to the bottom flange 212 than the top flange 202, i.e., the channel 222 can be offset from the top flange 202 by more than half of the flange offset distance 218.

Figure 2:
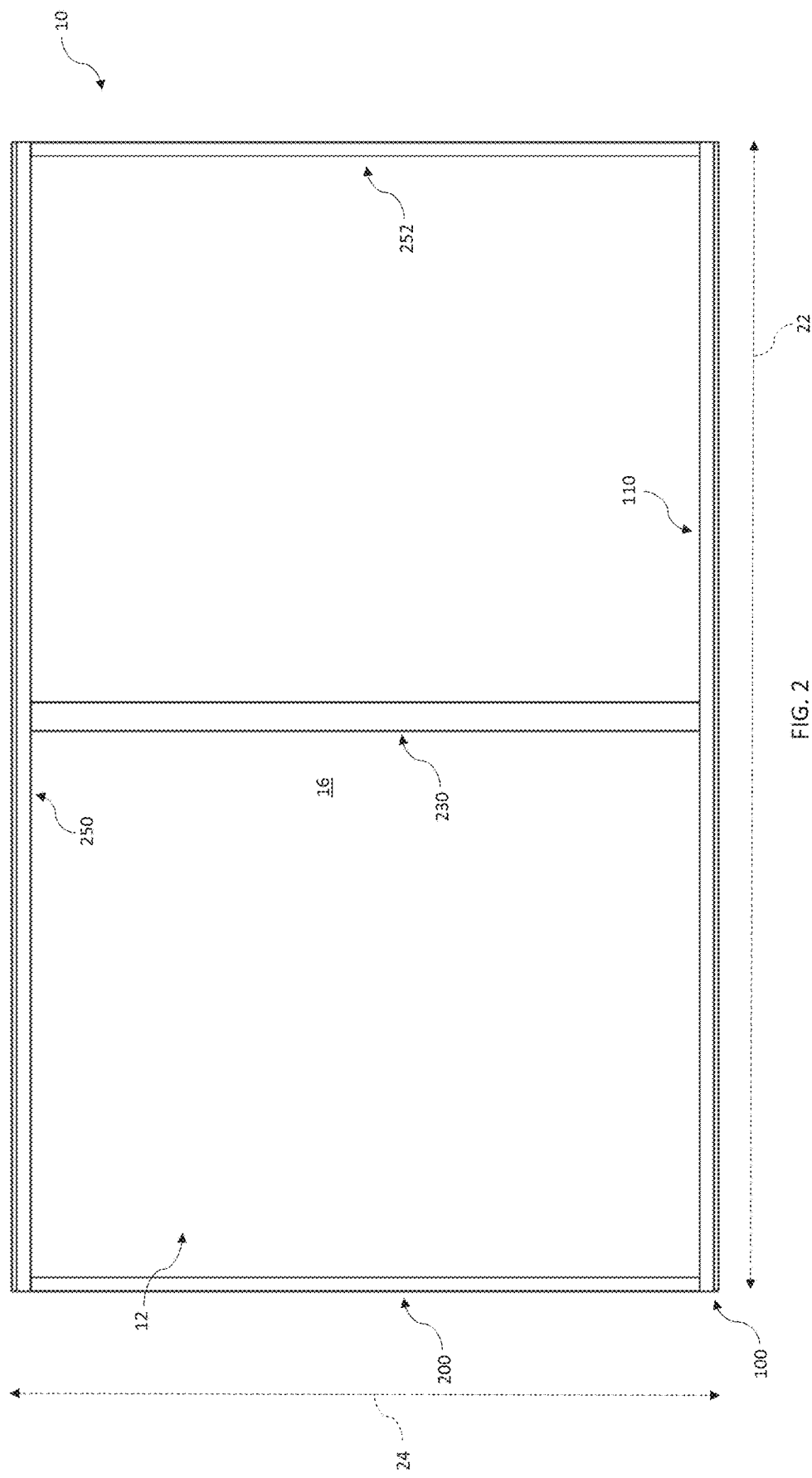
FIG. 2 schematically depicts a bottom view of the photovoltaic device of FIG. 1 according to one or more embodiments shown and described herein.
Figure 8:
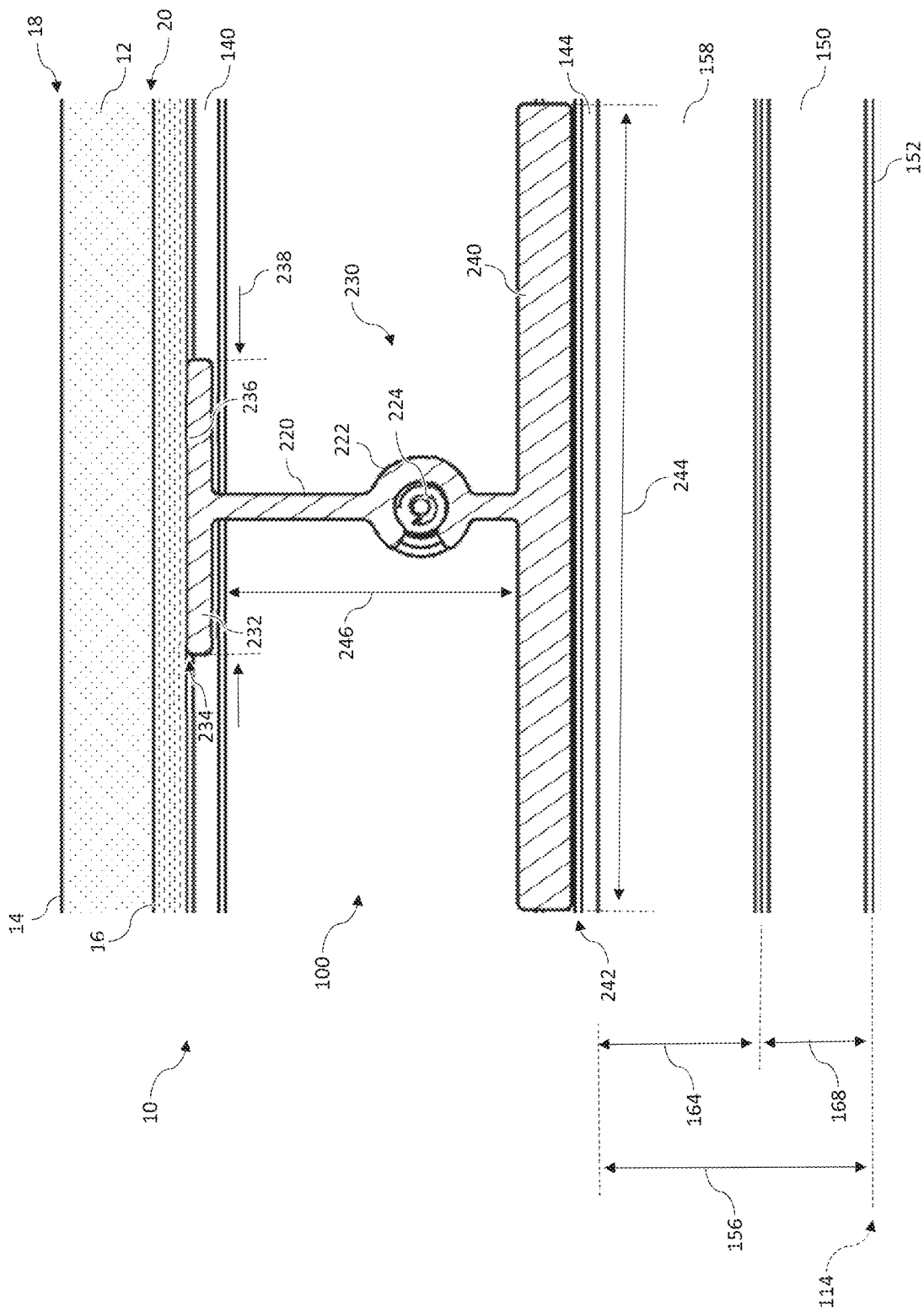
FIG. 8 schematically depicts a cross-sectional view of the photovoltaic device of FIG. 1 taken along 8-8 according to one or more embodiments shown and described herein.

Referring collectively to FIGS. 2 and 8, the frame assembly 100 can include a cross beam 230 for added strength. The cross beam 230 can be formed from rigid materials, as described above with respect to the rail 110. The cross beam 230 can include a top flange 232 located at a top side 234 of the cross beam 230. The top flange 232 can define a coupling surface 236 provided at the top side 234 of the cross beam 230.

The cross beam 230 can include a bottom flange 240 located at a bottom side 242 of the cross beam 230. The bottom flange 240 can extend along a width 244. In some embodiments, the width 244 of the bottom flange 240 can be greater than the width 238 of the top flange 232. For example, the width 244 of the bottom flange 240 can be at least about 150% of the width 238 of the top flange 232 such as, for example, greater than about 200% in one embodiment, or between about 175% and about 350% in another embodiment. The bottom flange 240 can be offset from the top flange 232 by a flange offset distance 246. A web 220 including a channel can span the flange offset distance 246 to connect the top flange 232 to the bottom flange 240. In some embodiments, the channel 222 can be located closer to the bottom flange 240 than the top flange 232, i.e., the channel 222 can be offset from the top flange 232 by more than half of the flange offset distance 246.

Referring collectively to FIGS. 1-8, embodiments of the frame assembly 100 can include the rail 110, a second rail 250, which is substantially the same as the rail 110, the support beam 200, and a second support beam 252, which is substantially the same as the support beam 200. The rail 110 and the second rail 250 can be offset from one another along the width 24 of the frame assembly 100. The interior side 122 of the rail 110 and the second rail 250 can face one another and demarcate a span along the width 24 of the frame assembly 100. The support beam 200 and the second support beam 252 can be offset from one another along the length 22 of the frame assembly 100. The frame assembly 100 can have substantially rectangular shape formed by coupling the ends of the support beam 200 to one end of each of the rail 110 and the second rail 250, and coupling the ends of the second support beam 252 to one end of each of the rail 110 and the second rail 250. Specifically, the rib 140 of the top interior projection 138 can contact the top flange 202, the rib 144 of the bottom interior projection 142 can contact the bottom flange 212, and the fastener 224 can be mated with the channel 222. Optionally, the cross beam 230 can be centrally coupled to each of the rail 110 and the second rail 250, and span the rail 110 and the second rail 250. Specifically, the rib 140 of the top interior projection 138 can contact the top flange 232, the rib 144 of the bottom interior projection 142 can contact the bottom flange 240, and the fastener 224 can be mated with the channel 222.

The frame assembly 100 can be bottom mounted to the module 12. For example, the back sheet 14 of the module 12 can be coupled to the frame assembly 100. Specifically, the coupling surface 118 of the rail 110 and the rail 250 can be adhered to the back sheet 14 of the module 12 with an adhesive 254. Additionally, the coupling surface 206 of the support beam 200 and the support beam 252 can be adhered to the back sheet 14 of the module 12 with the adhesive 254. Moreover, the coupling surface 236 of the cross beam 230 can be adhered to the back sheet 14 of the module 12 with the adhesive 254.

Generally, the frame assembly 100 forms a larger perimeter than the module 12. In some embodiments, the module 12 can have an edge 26 that defines a perimeter of the module 12. The edge 26 of the module 12 can be recessed such that the frame assembly 100 extends beyond the edge 26 of the module 12. For example, the edge 26 can be offset from the exterior side 124 of the coupling surface 118 of the rail 110. In some embodiments, the edge 26 of the module 12 can be offset from the riser 132 towards the interior side 122 of the rail 110. Likewise, the edge 26 can be offset from the exterior side 124 of the coupling surface 206 of the support beam 200.

Referring collectively to FIGS. 9A and 9B, embodiments of the present disclosure can be configured for ease of assembly. For example, an array can include a photovoltaic device 10 adjacent to a second photovoltaic device 30. The exterior side 124 of the rail 110 of the photovoltaic device 10 can be offset from the exterior side 124 of the rail 250 of the second photovoltaic device 30. A clamping mechanism 32 can secure the support surface 152 of each of rail 110 and the rail 250 to structure 34.

With reference to FIG. 9A, the clamping mechanism 32 can be coupled to the structure 34 and provide a force upon the recessed surface 126 that urges the recessed surface 126 towards the structure 34. Accordingly, the clamping mechanism 32 can mount the photovoltaic device 10 and the second photovoltaic device 30 to the structure 34. In embodiments where the exterior side 124 of the recessed surface 126 and the base member 150 are flush, the clamping mechanism 32 can be placed into contact with the support surface 118 and the base member 150 of both the rail 110 and the rail 250. In such an arrangement, the clamping mechanism 32 can be used as a guide that aligns adjacent devices in an array, which can reduce installation time.

With reference to FIG. 9B, the clamping mechanism 32 can be coupled to the structure 34 and provide a force upon the slot 170 that urges the slot 170 towards the structure 34. The force of the clamping mechanism 32 can mount the photovoltaic device 10 and the second photovoltaic device 30 to the structure 34. In embodiments where the slot 170 is provided in a controlled location, the slot 170 can operate as a datum feature. Accordingly, the clamping mechanism 32 and the slot 170 can cooperate to align adjacent devices in an array, which can also reduce installation time. For example, bores 174 (FIG. 5) of adjacent devices can be aligned such that the bores 174 can be used simultaneously to support wire management harnesses.

Figure 10:
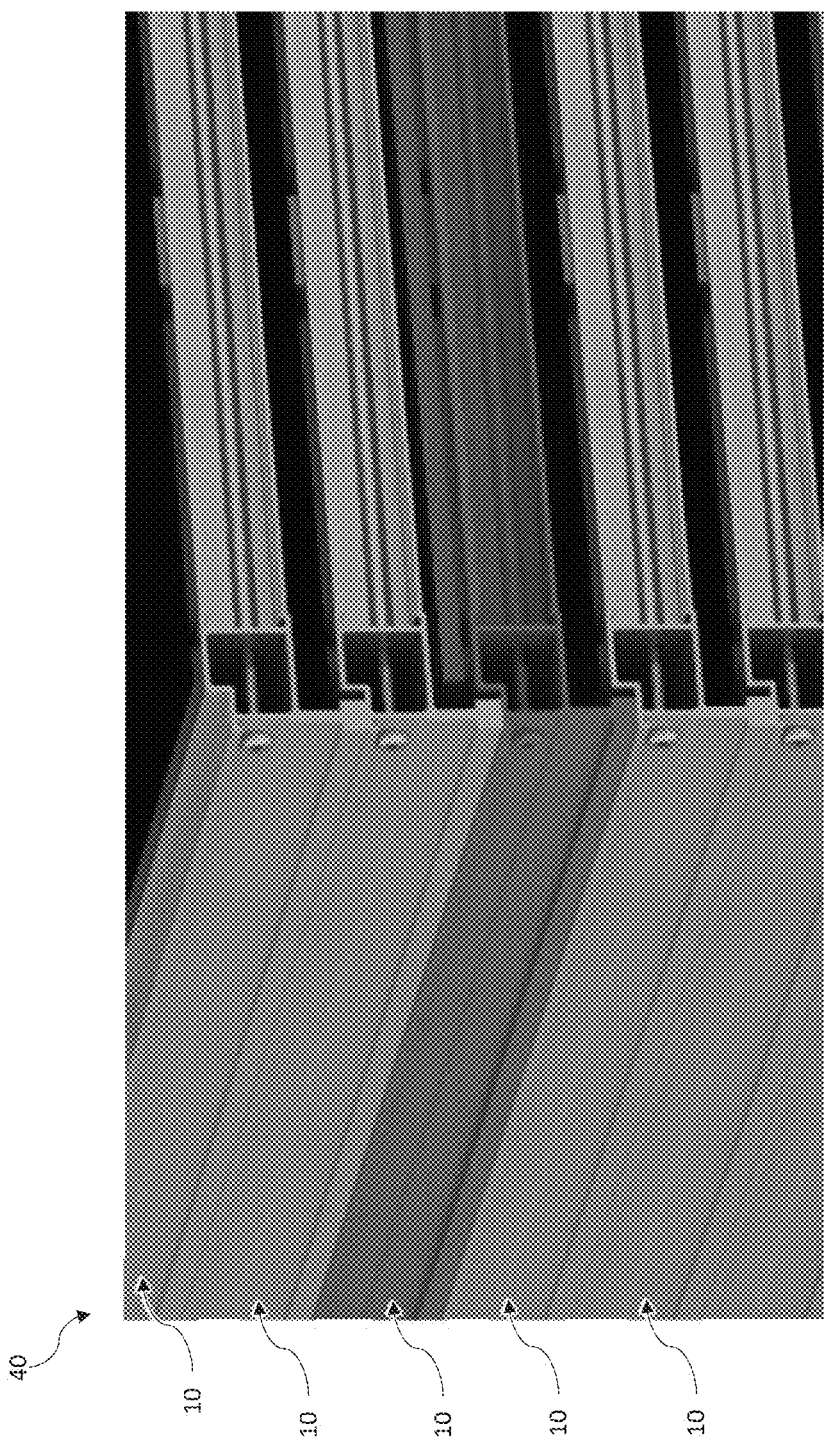
FIG. 10 schematically depicts a stack of photovoltaic devices according to one or more embodiments shown and described herein.

Referring collectively to FIGS. 5, 6, and 10, the embodiments provided herein can be configured for a reduction the amount of shipping material used in shipping a stack 40 of photovoltaic devices 10. The stack 40 can include photovoltaic devices 10 stacked upon one another such that the recessed surface 126 of a first device supports the support surface 152 of the next device. The base member 150, the recessed surface 126, and the riser 132 of each photovoltaic device 10 can be configured such that each subsequent device of the stack 40 nests upon the previous device. Testing has indicated that stacks of at least 18 devices can be provided upon one another without the need for any packing material between adjacent devices. For example, the stack can be provided between wooden pallets, secured with binding straps, and transported, without the need for any additional packing material.

According to the embodiments provided herein, a photovoltaic device can include a module and a frame assembly including a rail. The module can have an edge formed around a perimeter of the module. The module can include a semiconductor material located between a front sheet and a back sheet. The rail can include a coupling surface at a top side of the rail, and a recessed surface offset from the coupling surface and towards a bottom side of the rail. The coupling surface can extend from an interior side of the rail towards an exterior side of the rail. The recessed surface can be offset from the coupling surface by a recess distance. The coupling surface at the top side of the rail can be coupled to the back sheet of the module. The edge of the module can be offset from an exterior side of the rail towards the interior side of the rail.

It is noted that directional references such as, for example, front, back, downward, length, width, top, bottom, height, and the like are provided for clarity and without limitation. Specifically, it is noted such directional references oriented with respect to the normal of a face and the sides of a substantially flat and rectangular body. The directions may be reversed or oriented in any direction by making corresponding transformations to provided coordinate system described herein.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A photovoltaic device comprising:
    a module having an edge formed around a perimeter of the module, wherein the module comprises a semiconductor material located between a front sheet and a back sheet; and
    a rail comprising a coupling surface at a top side of the rail, a recessed surface offset from the coupling surface and towards a bottom side of the rail, and a riser that extends from the coupling surface to the recessed surface, wherein:
        the coupling surface extends from an interior side of the rail towards an exterior side of the rail;
        the recessed surface is offset from the coupling surface by a recess distance;
        the coupling surface at the top side of the rail is coupled to the back sheet of the module;
        the edge of the module is offset from an exterior side of the rail towards the interior side of the rail; and
        the edge of the module is offset from the riser towards the interior side of the rail.

2. The photovoltaic device of claim 1, wherein the riser is substantially orthogonal to both the coupling surface and the recessed surface.

3. A photovoltaic device comprising:
    a module having an edge formed around a perimeter of the module, wherein the module comprises a semiconductor material located between a front sheet and a back sheet; and
    a rail comprising a coupling surface at a top side of the rail, a recessed surface offset from the coupling surface and towards a bottom side of the rail, and a base member having a support surface located at the bottom side of the rail, wherein:
        the coupling surface extends from an interior side of the rail towards an exterior side of the rail;
        the recessed surface is offset from the coupling surface by a recess distance;
        the coupling surface at the top side of the rail is coupled to the back sheet of the module;
        the edge of the module is offset from an exterior side of the rail towards the interior side of the rail; and
        the support surface has a width that is less than a width of the recessed surface.

4. The photovoltaic device of claim 3, wherein the base member is a body that provides a mounting surface at a height with respect to the support surface.

5. The photovoltaic device of claim 4, wherein the height of the mounting surface of the base member is between about 75% and about 150% of the recess distance.

6. The photovoltaic device of claim 5, wherein the width of the support surface is less than about 95% of the width of the recessed surface.

7. The photovoltaic device of claim 3, wherein the base member and the recessed surface are flush at the exterior side of the rail.

8. The photovoltaic device of claim 3, wherein the coupling surface is defined on a head section of the rail, and the head section comprises a bottom face positioned between the top side and the bottom side of the rail.

9. The photovoltaic device of claim 8, wherein a base offset distance is defined between the support surface of the base member and the bottom face of the head section, and the base offset distance is greater than the recess distance.

10. The photovoltaic device of claim 9, wherein the base offset distance is at least about 125% of the recess distance.

11. The photovoltaic device of claim 8, comprising a support plate extending between the head section and the base member, wherein the support plate defines a height.

12. The photovoltaic device of claim 11, wherein the height of the support plate is greater than the recess distance.

13. The photovoltaic device of claim 11, comprising a slot formed in the support plate, wherein the slot comprises a flat bottom.

14. The photovoltaic device of claim 11, comprising a threaded bore formed in the support plate.

15. The photovoltaic device of claim 1, comprising a beam having a top flange and a bottom flange, and wherein the beam is coupled to the rail.

16. The photovoltaic device of claim 15, wherein a width of the bottom flange is greater than a width of the top flange.

17. The photovoltaic device of claim 1, wherein the coupling surface at the top side of the rail is coupled to the back sheet of the module with an adhesive.

18. A stack of photovoltaic devices comprising:
  a first photovoltaic device comprising:
    a module having an edge formed around a perimeter of the module, wherein the module comprises a semiconductor material located between a front sheet and a back sheet; and
    a rail comprising a coupling surface at a top side of the rail, and a recessed surface offset from the coupling surface and towards a bottom side of the rail, wherein:
      the coupling surface extends from an interior side of the rail towards an exterior side of the rail;
      the recessed surface is offset from the coupling surface by a recess distance;
      the coupling surface at the top side of the rail is coupled to the back sheet of the module; and
      the edge of the module is offset from an exterior side of the rail towards the interior side of the rail; and
  a second photovoltaic device comprising a second base member having a support surface located at a bottom side of a second rail, wherein:
    the support surface of the second rail has a width that is less than the width of the recessed surface; and
    the support surface of the second rail contacts the recessed surface.

19. The photovoltaic device of claim 16, comprising a base member having a support surface located at the bottom side of the rail, wherein the support surface has a width that is less than a width of the recessed surface.

20. A photovoltaic device comprising:
  a module having an edge formed around a perimeter of the module, wherein the module comprises a semiconductor material located between a front sheet and a back sheet;
  a rail comprising a coupling surface at a top side of the rail, and a recessed surface offset from the coupling surface and towards a bottom side of the rail, and
  a beam having a top flange and a bottom flange, wherein:
    the coupling surface extends from an interior side of the rail towards an exterior side of the rail;
    the recessed surface is offset from the coupling surface by a recess distance;
    the coupling surface at the top side of the rail is coupled to the back sheet of the module;
    the edge of the module is offset from an exterior side of the rail towards the interior side of the rail;
    the beam is coupled to the rail; and
    a width of the bottom flange is greater than a width of the top flange.

* * * * *